United States Patent [19]

Mehta

[11] Patent Number: 4,758,459
[45] Date of Patent: Jul. 19, 1988

[54] MOLDED CIRCUIT BOARD

[75] Inventor: Mahendra C. Mehta, Palm Beach Gardens, Fla.

[73] Assignee: Northern Telecom Limited, Montreal, Canada

[21] Appl. No.: 7,640

[22] Filed: Jan. 28, 1987

[51] Int. Cl.[4] .......... B32B 3/10; H05K 7/10; C04B 35/00; H01K 3/22
[52] U.S. Cl. .................. 428/131; 428/209; 428/901; 174/68.5; 361/403; 264/104; 29/848
[58] Field of Search .......... 428/209, 131, 901; 174/68.5; 361/403; 264/104; 29/848

[56] References Cited

U.S. PATENT DOCUMENTS

| 4,295,183 | 10/1981 | Miersch et al. | 361/403 |
| 4,402,135 | 9/1983 | Schaeingruber et al. | 29/832 |
| 4,403,107 | 9/1983 | Hoffman | 174/68.5 |
| 4,433,009 | 2/1984 | Henze et al. | 427/97 |
| 4,604,799 | 8/1986 | Gurol | 29/897 |
| 4,614,837 | 9/1986 | Kane et al. | 174/68.5 |

FOREIGN PATENT DOCUMENTS 268304 4/1964 Australia .............. 428/901

OTHER PUBLICATIONS

IBM Tech. Disclosure Bulletin, vol. 20, No. 7, p. 2615, Dec., 1977, McBride.
Western Electric Tech. Digest No. 15, Jul., 1969, p. 15, Mayer.
IBM Tech. Discl. Bull., vol. 1, No. 6, Apr., 1959, Kellneir, p. 18.

Primary Examiner—John E. Kittle
Assistant Examiner—Patrick J. Ryan
Attorney, Agent, or Firm—Foley, Lardner, Schwartz, Jeffery, Schwaab, Mack, Blumenthal & Evans

[57] ABSTRACT

A circuit board is molded of a heat resistant synthetic resin. Component mounting positions are formed at the time of molding, the mounting positions comprising formations, such as recesses or protrusions, on at least one surface. A circuit pattern is formed on at least one surface and the circuit pattern extends to and over a surface of each formation. A circuit board can be planar or non-planar and be of any desired shape, not necessarily rectangular.

27 Claims, 6 Drawing Sheets

MOLDED CIRCUIT BOARD

BACKGROUND OF THE INVENTION

1. Field of the Invention

This invention relates to molded circuit boards.

2. Related Art

Circuit boards conventionally are made from fiber reinforced synthetic resin and from ceramic, the ceramic boards, or substrates, normally being for relatively small boards and often experiencing high temperatures in use. Fiber reinforced synthetic resin boards can vary considerably in size.

Various disadvantages relate to conventional materials. Ceramic is not available in large sizes, drilling for through hole connection is not economical, and there is a possibility of breakage. The cost of a ceramic board or substrate increases rapidly with increase in size and in thickness, particularly over 4"×4" or over 0.04" in thickness, or both. Fiber reinforced synthetic resin can be obtained in large sizes, but is only readily available in planar rectangular form. Circuit boards of such material are readily drilled, but thermal mismatch can occur between the board and ceramic packaged components, or ceramic substrates, mounted on the board. A normal circuit board having a circuit pattern thereon requires numerous process steps to produce.

Conventional circuit boards have planar surfaces, with circuit patterns formed on one or both surfaces. Mounting of some components can be difficult as they are not of stable form, for example cylindrical, or having only two contact positions which do not support the component in a stable position.

SUMMARY OF THE INVENTION

The present invention provides a circuit board which is molded in a heat resistant synthetic resin, with component mounting positions comprising formations formed at the time of molding. Such formations may comprise protrusions or recesses. Positioning and support formations can also be formed at the time of molding, and also holes and apertures. Contact areas and circuit patterns can be formed by deposition, vacuum plating or by molding in at the manufacturing stage. A three dimensional aspect can be obtained by molding integral protrusions, such as pillars, ribs or walls. The invention can be used for relatively small circuit boards and also for large boards, such as backplanes as used in switching and transmission systems for telecommunications. Shapes other than rectangular can be provided.

BRIEF DESCRIPTION OF THE DRAWINGS

The invention will be readily understood by the following description of certain embodiments, by way of example, in conjunction with the accompanying drawings, in which.

DETAILED DESCRIPTION OF THE EMBODIMENTS

Figure 1:
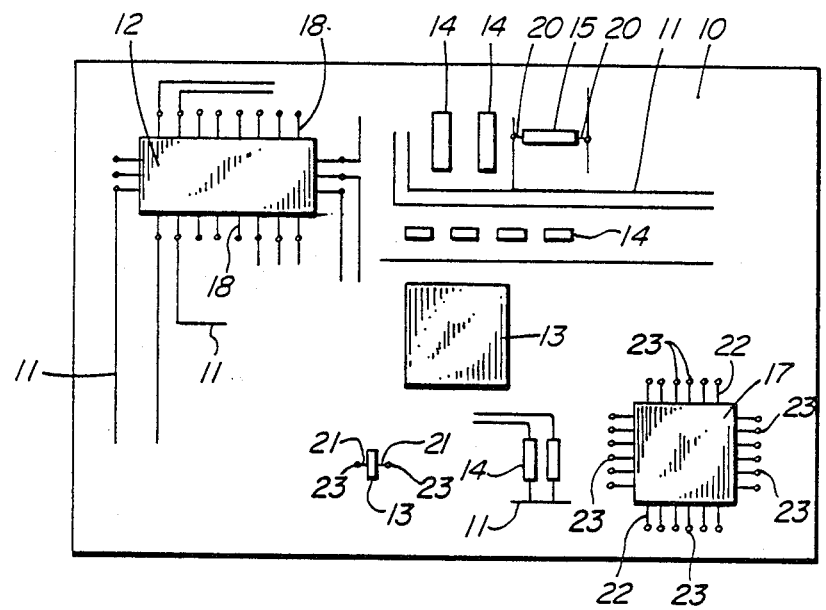
FIGS. 1 and 2 are a plan view and a side view, respectively, of one form of conventional circuit board.
Figure 2:
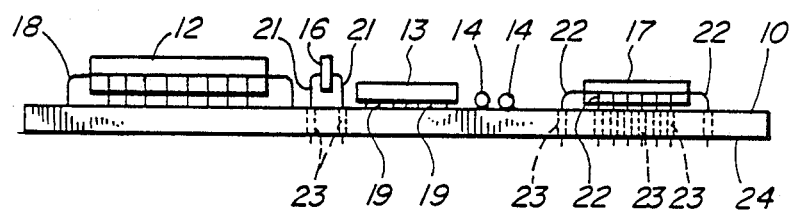

FIGS. 1 and 2 illustrate, rather diagrammatically, one form of conventional circuit board, normally referred to as a printed circuit board (PCB). The board 10 is of conventional form, being of glass fiber reinforced resin. On a surface thereof, a circuit pattern 11 is produced, and a plurality of components of differing forms, are mounted on the surface and connected to the circuit pattern. The spacing of the conductor paths of the circuit pattern 11 would be much closer than shown and the density of components would be much higher.

Typical components are integrated circuit (IC) packaged components 12 and 13, component 12 being mounted on the top surface and connected to the circuit pattern by leads 18. Component 13 is surface mounted, that is, it is connected to the circuit pattern 11 by contact pads 19 on the bottom of the component which are soldered to contact areas on the circuit pattern. Components 14 are also surface mounted by means of contact areas on a component being soldered to the circuit pattern. These components could be small capacitors and resistors, for example. Component 15 is connected to the circuit pattern by leads 20. With components 16 and 17, leads 21 and 22 respectively pass through holes 23 in the board and are connected to a circuit pattern on the other surface 24.

Figure 3:
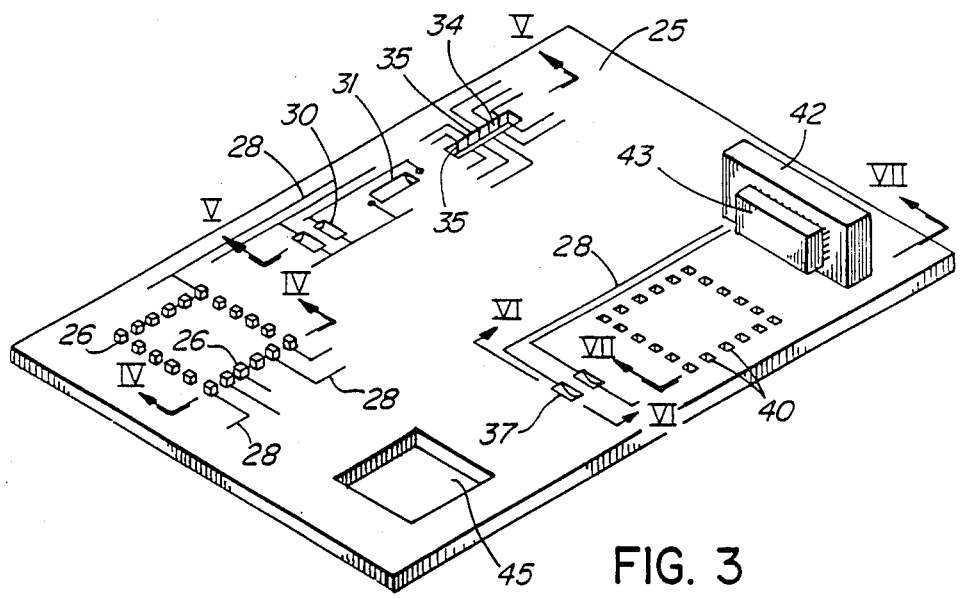
FIG. 3 is a perspective view of one form of circuit board according to the present invention.
Figure 4:
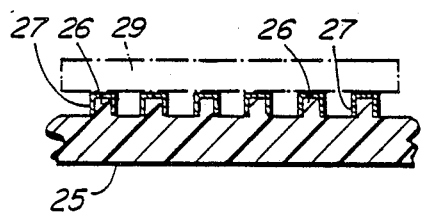
FIGS. 4, 5, 6 and 7 are cross-sections on the lines IV—IV, V—V, VI—VI and VII—VII, respectively, of FIG. 3.

FIG. 3 illustrates a circuit board 25 which is of molded form. The board is of a moldable synthetic resin having heat resistant capabilities. One such material is the polysulphone family of synthetic resins. The board, in the example, is provided with contact formations of varying form. At one position, a plurality of protrusions 26 are formed, the protrusions in a pattern suitable for mounting packaged ICs. The protrusions 26 are formed at the time the board is molded. Each protrusion has a conductive coating 27. This coating may extend over the whole protrusion, as illustrated in FIG. 4. Alternatively, the coating may extend for only part of the surface of a protrusion. The coating connects to a circuit pattern 28 (FIG. 3). A component 29 is mounted on the protrusions 26 as shown in dotted outline.

Figure 5:
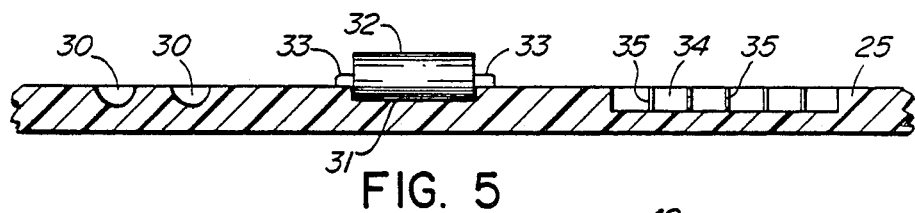

FIG. 5 illustrates the provision of recesses 30 and 31, for positioning components, as also shown in FIG. 3. Recesses 30 are for components, such as resistors, which are normally surface mounted, having contact areas formed directly on the ends of each component. Such components are often cylindrical and are difficult to position on a conventional board. The recesses 30 provide location and positioning of such components. The circuit pattern 28 connects to a conductive layer at each end of the recess, the component connected by soldering. Recess 31 acts to locate and position a cylindrical component 32, not shown in FIG. 3, which is connected by leads 33. Such a component is not stable when positioned on a normal board. Either holes through the board are required or the component is mounted by hand, being held in position while hand soldered. This is slow and costly. By the arrangement shown in FIGS. 3 and 5, the leads 33 can be cut short, the component 32 placed in the recess 31 and the leads connected to the circuit pattern during the normal soldering step. A further form of recess, 34, is particularly useful for mounting DIP components, and similar components. Contact stripes 35 connected to the circuit pattern 28, make contact with contact areas on the components. Leads are avoided.

Figure 6:
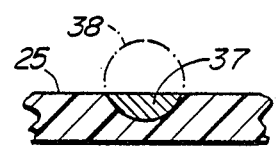

FIG. 6 illustrates the recesses 37, two of which are seen in FIG. 3. These recesses also locate and position a form of component which is normally unstable on a conventional board. Such a component may be a thermistor, a relay, a film leaded capacitor, and other components, such as is illustrated in dotted outline at 38. The component may have a lead on each flat surface which can pass through holes in the board or which can be trimmed to make contact with pads on the circuit pattern. However, it is easy to connect the component directly as the flat surfaces are plated and can be directly soldered to a conductive layer on each end surface of a recess, as indicated on 34 in FIG. 6. If desired, holes 39 can also be formed in the circuit board at the time of molding, and these holes can be plated on the bore surfaces.

Figure 7:
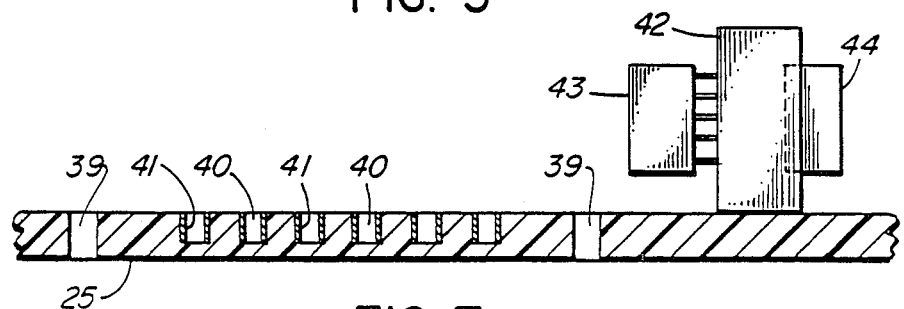

Illustrated in FIG. 3 and FIG. 7 is an alternative arrangement to the protrusions 26. A plurality of recesses 40 are molded into the board and one or more of the side surfaces of each recess 40 has a conductive layer—indicated at 41 in FIG. 7. With this arrangement, packaged IC components, for example, can have protrusions on the lower surface which will engage in the recesses 40. A row of recesses as at 40 in FIG. 7 can serve for end mounting a small separate circuit board onto a main circuit board. Small extensions on the end of the small board, plated with conductive material, engage in the recesses 40 and make contact with the layers 41, the contact being made permanent by soldering.

A further modification of a board, illustrated in FIGS. 3 and 7, is a three-dimensional aspect. A rib or wall 42 is molded integrally with the main part of the board 25. Components 43 and 44 can be mounted on the wall, on one or both sides. In the example, component 43 is a leaded component and component 44 is mounted in a recess. The circuit pattern is extended over the wall, as necessary, and provides solder pads for component 43 and solder contact areas in the recess for component 44. It is also possible for the leads of component 43 to be inserted into holes extending into, and even through, the wall. More than one such wall can be provided. A wall can be short, for example generally square when viewed on the top end. A wall can extend right across a board.

As can be appreciated, the protrusions 26, recesses 30, 34 and 40, and other required formations such as slots, can be of varied form and shape, being readily formed during molding. Also, it may be desirable to provide apertures in the board, for various reasons, and these can also be formed when the circuit board is molded. An example of an aperture is seen at 45 in FIG. 3.

The board readily withstands the temperatures experienced during soldering of components to the circuit pattern. Also, the board can withstand operation of components at a higher temperature than can a conventional reinforced synthetic resin board.

While a rectangular board is shown in FIG. 3, other shapes can be used, for example, circular and polygonal. Also, a board need not be planar but can have a curved form.

The density of the various mounting arrangements illustrated in FIG. 3 is much lower than would normally be the case. This is for clarity. Also, not all mounting arrangements need be on any particular circuit board. After components have been positioned, electrical connection can be made by reflow soldering.

Figure 8:
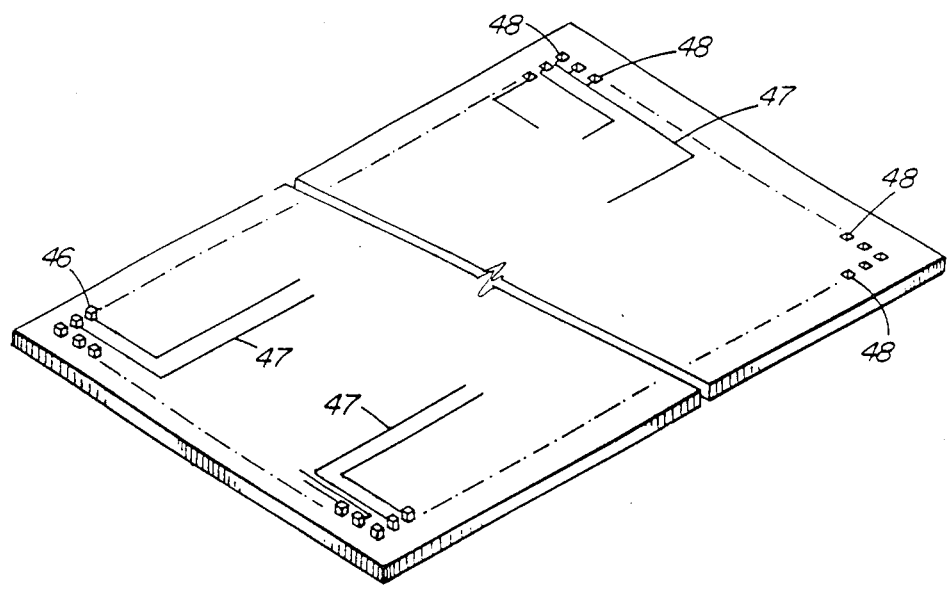
FIG. 8 is a perspective view of a backplane circuit board, with protrusion and recessed contact positions.

A particular use of the invention is for backplanes, as used in telecommunications systems. A plurality of circuit boards are "plugged into" a backplane. Various forms of connecting means are used for mounting and connecting the circuit boards to the backplane. FIG. 8 illustrates a backplane having two alternative forms of mounting and connection. At one end of the board in FIG. 8 there is illustrated a plurality of protrusions 46. The protrusions are arranged in a predetermined pattern, usually in columns and rows. Each protrusion has a conductive surface and is connected to a circuit pattern 47, as will be seen in more detail in FIGS. 9 and 10 described later.

At the other end of the backplane illustrated in FIG. 8 there is illustrated a plurality of recesses 48, in a predetermined pattern, usually in columns and rows. The recesses have a conductive surface and are connected to the circuit pattern 47, as will be seen in FIGS. 11 and 12 and described later. In the drawing of FIG. 8, the board is shown as being of the same thickness for both ends. In actual manufacture, a board having recesses 48 can be thicker than a board having protrusions, although the thickness over the protrusions could be the same as the thickness of the board with recesses.

Figure 9:
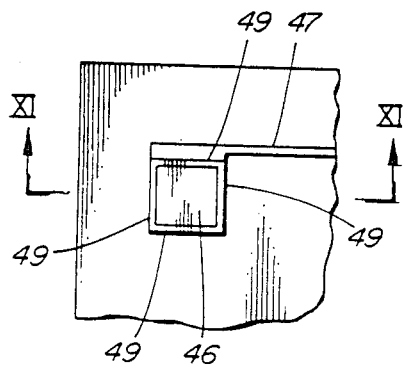
FIG. 9 is a plan view on one protrusion contact position to a larger scale.
Figure 10:
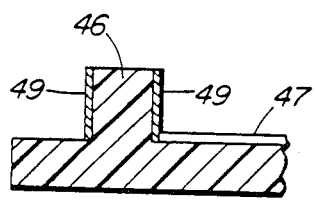
FIG. 10 is a plan view of a recess contact position to a larger scale.

FIGS. 9 and 10 illustrate in more detail one protrusion 46. Conductive surface 49 is shown as being on all four side surfaces of the protrusion. While a highly effective connection will be made with conductive surface or layer 49 being on all side surfaces, only two, or even one such surface need to be provided. The conductive surfaces are connected to the conductor pattern 47.

Figure 11:
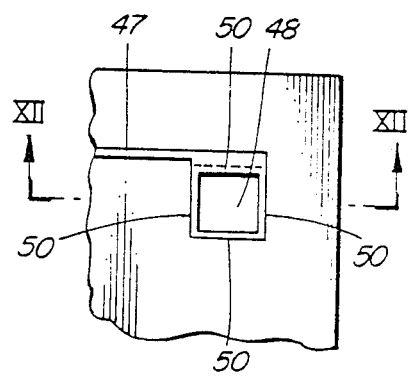
FIG. 11 is a cross-section on the line XI-XI of FIG. 9.
Figure 12:
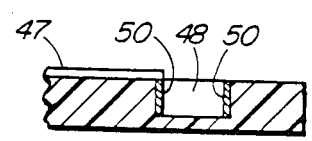
FIG. 12 is a cross-section on the line XII-XII of FIG. 10.

FIGS. 11 and 12 illustrate in more detail a recess 48. The conductive surface or layer is shown at 50 and may be one or more surfaces of the recess.

Figure 13:
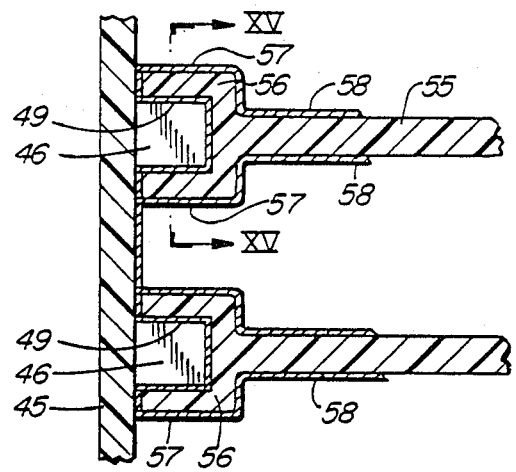
FIGS. 13 and 14 are side views on the backplane circuit board of FIG. 8, illustrating mounting of circuit boards with protrusion contact positions and recess contact positions respectively.
Figure 14:
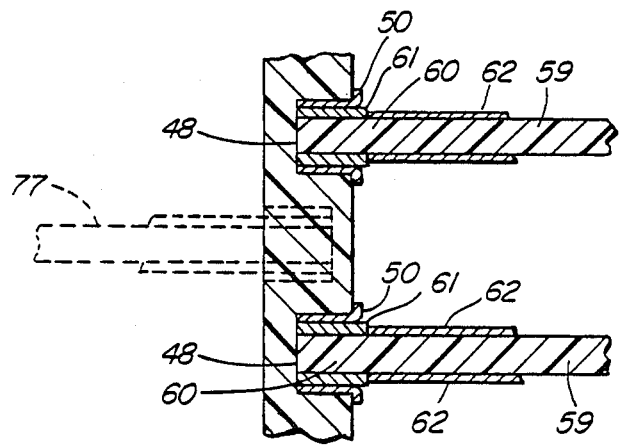
Figure 15:
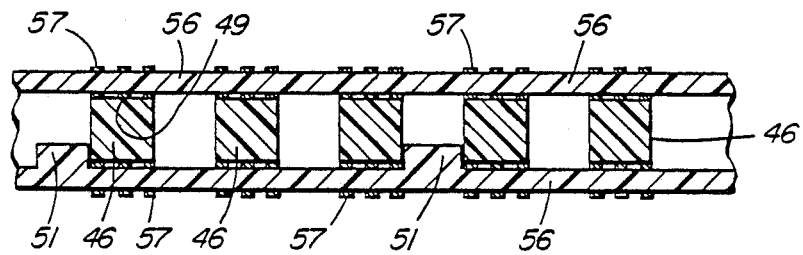
FIG. 15 is a cross-section on the line XV—XV of FIGS. 13.

FIGS. 13, 14 and 15 illustrate the two arrangements for mounting. In FIG. 13, a circuit board 55 has an enlarged end 56 which fits over a row of protrusions 46. The end 56 can have a continuous groove with a pattern of spaced conductor strips provided to make contact with the conductive surface or layer 49 on opposite surfaces of each protrusion 46. Alternatively, a series of spaced recesses can be formed in the end 56, dimensioned to be a close fit over protrusions 46. The inner surfaces of such recesses have conductive surfaces or layers to make contact with layers or surfaces 49. The conductive strips or conductive surfaces or layers continue round the end surfaces of end 56 and up the outer surfaces, at 57, to connect with a circuit pattern 58 on board 55. Ribs 51 can be provided, on the end 56 for example, for alignment as shown in FIG. 15. Instead of a row of protrusions 46, a single long protrusion can be provided.

FIG. 14 illustrates an arrangement in which a circuit board 59 is provided with a series of protrusions 60 at one end, which fit into recesses 48. Conductive layers 61 make contact with the surfaces or layers 50, and extend up to and connect to circuit patterns 62 on the board 59. A cross-section through one board end 56 and a number of protrusions 46 is shown in FIG. 15.

In FIGS. 13 and 14 the boards 55 and 59 are shown with circuit patterns, 58 and 62, on both surfaces. A board may have a circuit pattern on only one surface. The boards 55 and 59 may themselves be of a form in accordance with the present invention.

Figure 16:
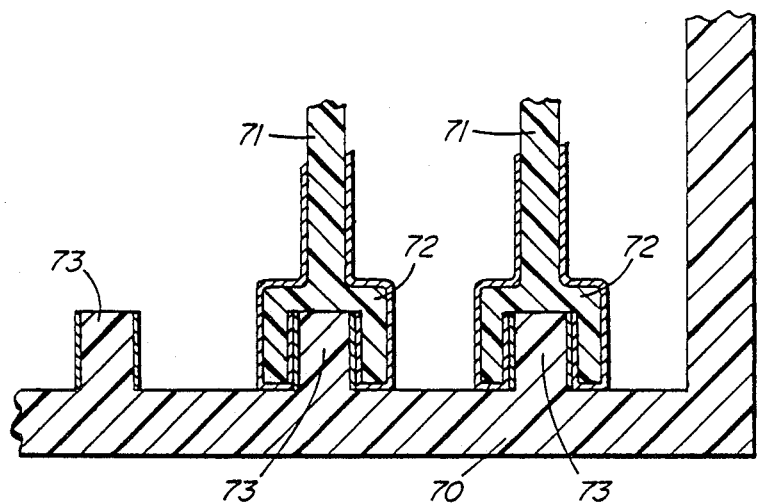
FIG. 16 is a side view of a form of backplane or other form of circuit board in the form of a drawer.

FIG. 16 illustrates an arrangement in which a backplane 70 forms a structural unit, for example, a drawer in an electronic equipment cabinet. A plurality of circuit boards 71 connect to the backplane 70 by enlarged ends 72 which engage over protrusions 73, in a similar manner to that illustrated in FIG. 13.

Figure 17:
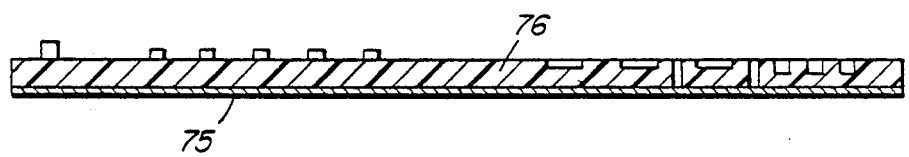
FIG. 17 is a cross-section through a circuit board in accordance with the invention, illustrating a modification.

In FIG. 17 there is shown the features of a metal layer 75 on the back surface of a backplane 76, or other circuit board. Such a metal layer can act as a RFI and EMI protector or screen, and also as a heat sink or spreader. Also, direct connection to certain components can be made from the metal layer.

Additional circuit boards can be mounted on the other side of the backplanes illustrated in FIGS. 13 and 14, for example as illustrated in dotted outline at 77 in FIG. 14.

Figure 18:
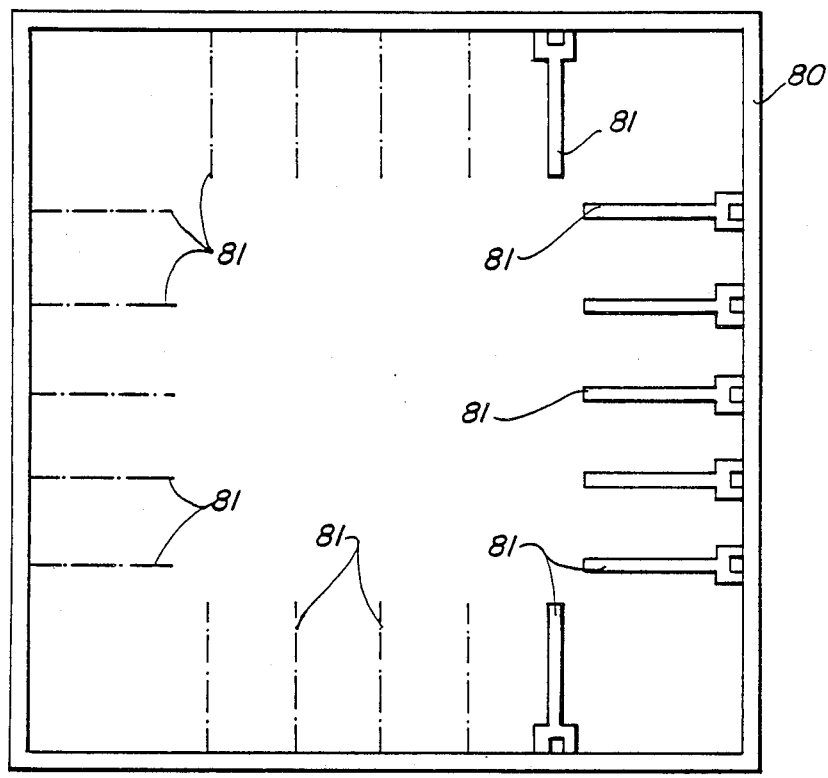
FIG. 18 is a top plan view of another form of molded circuit board.

FIG. 18 illustrates a further extension of the arrangement of FIG. 16. In this example, a main circuit board 80 is in the form of a large hollow box. A series of circuit boards 81 connect to the walls of the box 80, the board connecting as illustrated in FIG. 16 on engaging in recesses as in FIG. 15. In this arrangement, any connecting conductors or cables can be positioned in the center of the box. By metalization of the outer surfaces of the walls of the box 80, screening can be obtained. The box 80 can be made by molding, as can also the circuit boards 81.

The conductive paths, surfaces or layers, strips and other circuit and conductor patterns, can be formed in a number of ways. Thus the patterns and other features can be molded in, deposited as by plating or by vacuum deposition. Other methods can be used. Parts or all of a circuit pattern or other feature can be tin plated after the initial formation.

While several embodiments of the invention have been described, it will be understood that it is capable of further modification, and this application is intended to cover any variations, uses, or adaptations of the invention, following in general principles of the invention and including such departures from the present disclosure as to come within knowledge or customary practice in the art to which the invention pertains, and as may be applied to the essential features hereinbefore set forth and falling within the scope of the invention or the limits of the appended claims.

What is claimed is:

1. A circuit board of molded heat resistant synthetic resin, comprising: a circuit pattern on at least one of opposite surfaces of said board; a plurality of component mounting positions molded on at least one said surface, said mounting positions further comprising integrally molded formations, said circuit pattern extending to said formations and over at least part of a surface of each of said formations to form contacts.

2. A circuit board as claimed in claim 1, said formations comprising recesses in said at least one surface.

3. A circuit board as claimed in claim 1, said formations comprising protrusions on said at least one surface.

4. A circuit board as claimed in claim 1, said formations comprising holes through said board.

5. A circuit board as claimed in claim 1, comprising a flat, planar molded board.

6. A circuit board as claimed in claim 1, having a rectangular plan form.

7. A circuit board as claimed in claim 1, at least one of said mounting positions comprising a wall extending from at least one surface, and at least one component mounting position on said wall.

8. A circuit board as claimed in claim 7, including a component mounting position on opposite sides of said wall.

9. A circuit board as claimed in claim 1, including component mounting positions on both surfaces.

10. A circuit board as claimed in claim 1, said component mounting positions comprising mounting positions for further circuit boards.

11. A circuit board as claimed in claim 1, each said formation forming a contact formation for one contact of a component.

12. A circuit board as claimed in claim 1, at least one of said formations having a plurality of contact areas for mounting of a multi-contact component.

13. A circuit board as claimed in claim 1, said component mounting positions on one surface, and a metal layer on the other surface.

14. A circuit board as claimed in claim 1, said circuit board being in the form of a hollow box and including mounting positions on at least one wall of said box for mounting of further circuit boards thereon.

15. A circuit board as claimed in claim 1, including apertures formed in said board.

16. A method of forming a circuit board comprising the steps of:
    molding a heat resistant synthetic resin into a circuit board having a plurality of component mounting positions on at least one of opposite surfaces of said circuit board,
    integrally molding formations at said component mounting positions at the time of molding said resin into a said circuit board,
    forming a circuit pattern on at least one surface of said circuit board,
    extending said circuit pattern to said formation, and
    forming contacts at each said formation by extending said circuit pattern over at least a part of each said formation.

17. A method of forming a circuit board as recited in claim 16 wherein the step of molding formations further comprises forming recesses in at least one said surface.

18. A method of forming a circuit board as recited in claim 16 wherein the step of molding formations further comprises forming protrusions on at least one said surface.

19. A method of forming a circuit board as recited in claim 16 wherein the step of molding formations further comprises forming holes through said circuit board.

20. A method of forming a circuit board as recited in claim 16 wherein the step of molding a heat resistant resin into a circuit board further comprises forming a flat, planar molded board.

21. A method of forming a circuit board as recited in claim 16 further comprising:

forming a wall extending from at least one surface of said board, and forming at least one component mounting position on said wall.

22. A method of forming a circuit board as recited in claim 21 further comprising forming at least one component mounting position on opposite sides of said wall.

23. A method of forming a circuit board as recited in claim 16 further comprising forming component mounting positions on opposite surfaces of said circuit board.

24. A method for forming a circuit board as recited in claim 16 further comprising forming a contact area for one contact of a component of each said formation.

25. A method of forming a circuit board as recited in claim 16 further comprising forming at least one of said formations with a plurality of contact areas for mounting a multicontact components.

26. A method of a circuit board as recited in claim 16 furhter comprising forming component mounting positions on one surface of said circuit board and forming a metal layer on said opposite surface of said circuit board.

27. A mtheod of forming a circuit board as recited in claim 16 further comprising:

forming said circuit board in the form of a hollow box, and forming mounting positions for mounting further circuit boards in at least one wall of said hollow box.

* * * * *